(12) United States Patent
Chang et al.

(10) Patent No.: US 11,526,236 B2
(45) Date of Patent: Dec. 13, 2022

(54) TOUCH SENSING DEVICE

(71) Applicant: Samsung Electro-Mechanics Co., Ltd., Suwon-si (KR)

(72) Inventors: Sol Ji Chang, Suwon-si (KR); Gye Won Lee, Suwon-si (KR); Mun Sun Jung, Suwon-si (KR); Hong Seok Lee, Suwon-si (KR); Jong Yun Kim, Suwon-si (KR); Chang Ju Lee, Suwon-si (KR); Hee Sun Oh, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/321,879

(22) Filed: May 17, 2021

(65) Prior Publication Data

US 2022/0075500 A1  Mar. 10, 2022

(30) Foreign Application Priority Data

Sep. 7, 2020 (KR) .................. 10-2020-0113949
Dec. 23, 2020 (KR) .................. 10-2020-0182057
Apr. 5, 2021 (KR) .................. 10-2021-0044162

(51) Int. Cl.
*G06F 3/041* (2006.01)
*G06F 3/044* (2006.01)

(52) U.S. Cl.
CPC .......... *G06F 3/04186* (2019.05); *G06F 3/044* (2013.01); *G06F 2203/04105* (2013.01); *G06F 2203/04106* (2013.01)

(58) Field of Classification Search
None
See application file for complete search history.

(56) References Cited

U.S. PATENT DOCUMENTS

| | | | |
|---|---|---|---|
| 7,019,734 B2 | 3/2006 | Cross et al. | |
| 2003/0234769 A1 | 12/2003 | Cross et al. | |
| 2017/0364183 A1 | 12/2017 | Xiao | |
| 2018/0260050 A1* | 9/2018 | Unseld | G06F 3/0445 |
| 2019/0187856 A1* | 6/2019 | Bruwer | G06F 3/046 |

* cited by examiner

*Primary Examiner* — Stephen T. Reed
(74) *Attorney, Agent, or Firm* — NSIP Law

(57) ABSTRACT

A device with touch sensing includes a bracket, a pad disposed above one side of the bracket, the pad having a capacitance that varies as a touch is applied proximate to the device, and a sensing coil disposed below another side of the bracket that opposes the one side, with at least a portion of the sensing coil overlapping the pad.

41 Claims, 9 Drawing Sheets

TOUCH SENSING DEVICE

CROSS-REFERENCE TO RELATED APPLICATION(S)

This application claims benefit of priority to Korean Patent Application Nos. 10-2020-0113949, 10-2020-0182057, and 10-2021-0044162 filed on Sep. 7, 2020, Dec. 23, 2020, and Apr. 5, 2021, respectively, in the Korean Intellectual Property Office, the entire disclosures of all of which are incorporated herein by reference for all purposes in their entirety.

BACKGROUND

1. Field

The present disclosure relates to a touch sensing device.

2. Description of Related Art

In general, a thinner, simpler, and neater design may be preferred for a wearable device, and accordingly, a conventional mechanical switch may be disappearing. This has become possible as a model with a sense of unity in a smooth design is developed, together with implementation of dust-proof and water-proof technologies.

Currently, a touch on metal (ToM) technology, a capacitor sensing technology using a touch panel, a micro electro-mechanical system (MEMS), a micro strain gauge technology, and the like have been developed. Furthermore, even a force touch function has been developed in a recent trend.

The conventional mechanical switch internally requires a large-sized space to implement a switching function, and externally, has a structure that protrudes outwardly or is not integrally formed with an outer case. Thus, the conventional mechanical switch may be disadvantageous in that the design may not be neat and a large amount of space may be occupied.

Also, the conventional mechanical switch may be disadvantageous in that a user may directly contact the electrically connected mechanical switch, resulting in the risk of an electric shock, and in particular, it may be difficult to achieve dustproofing and waterproofing in the structure of the mechanical switch.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a device with touch sensing includes a bracket, a pad disposed above one side of the bracket, the pad having a capacitance that varies as a touch is applied proximate to the device, and a sensing coil disposed below another side of the bracket that opposes the one side, with at least a portion of the sensing coil overlapping the pad.

The sensing coil may have an inductance that varies while the sensing coil moves in a touch application direction of the applied touch.

The sensing coil and the pad may be electrically connected to each other to form a resonant circuit, and the resonant circuit may generate a resonance signal having a resonant frequency that varies as the touch is applied.

The device may further include a detection circuit electrically connected to the resonant circuit, where the detection circuit may be configured to generate a touch input signal based on an extent of change in resonant frequency of the generated resonance signal from the sensing coil moving in a touch application direction of the touch is applied.

The detection circuit may detect a location at which the touch is applied based on the change in the resonant frequency due to a change in capacitance of the pad, and generate a contact touch input signal including the detected location information.

The detection circuit may detect a strength of pressure by the applied touch based on the change in the resonant frequency due to a change in inductance of the sensing coil, and generate a force touch input signal matched with the detected strength of the pressure.

The pad may form a first resonant circuit, and the sensing coil may form a second resonant circuit, where the first resonant circuit may be configured to generate a first resonance signal having a first resonant frequency that that changes dependent on the applied touch, and where the second resonant circuit may be configured to generate a second resonance signal having a second resonant frequency that changes dependent on the applied touch.

The device may further include a detection circuit electrically connected to the first resonant circuit and the second resonant circuit, where the detection circuit may generate a contact touch input signal based on an amount of change in resonant frequency of the first resonance signal, and may generate a force touch input signal based on an amount of change in resonant frequency of the second resonance signal.

The bracket may be deformable from a non-deformed state due to no touching being applied to the device, to a deformed state to protrude in a direction toward the sensing coil as the touch is applied.

The device may further include a first substrate disposed between the pad and the bracket, and a second substrate disposed between the sensing coil and the bracket.

The first and second substrates may be connected to each other to form a single substrate.

The sensing coil may be a coil pattern inside the second substrate.

A winding axis of the sensing coil may coincide with a central axis of a contact surface of the pad.

The bracket includes a pair of support portions each extending in a lateral direction toward the sensing coil, and the sensing coil may be disposed between the pair of support portions.

The bracket may further include a pressurization portion adjacently between the pair of support portions, the pressurization portion being disposed between the sensing coil and the bracket, and the sensing coil may be disposed in an internal space surrounded by the pair of support portions and the pressurization portion.

The device may be a mobile electronic device that further includes a housing, where the touch that is applied proximate to the device may be a touch applied to a portion of the housing that disposed adjacent to the pad, which may be inside of the housing in the mobile electronic device.

The device may be a touch sensing module for use in touch detection based on a capacitance of the pad with respect to a human body portion that applies the touch, force detection with respect to the applied touch using the sensing coil.

In one general aspect, a device with touch sensing includes a bracket configured to deform from a non-deformed state due to no touching being applied to the device, to a deformed state due to a touch applied proximate to the device, a sensing coil disposed below one side of the bracket and having an inductance that varies while the sensing coil moves in the deformed state in a touch application direction as the bracket is deformed.

The device may further include a pad disposed above another side of the bracket that opposes the one side, wherein at least a portion of the pad may overlap the sensing coil, and where the pad may have a capacitance that varies in response to the touch being applied proximate to the device.

The device may further include a metal portion connected to the bracket and disposed to be spaced apart from the sensing coil, where the inductance of the sensing coil may vary as the sensing coil moves in the touch application direction toward the metal portion due to the applied touch.

The bracket and the metal portion may be spaced apart from each other to form an area therebetween, where the sensing coil may be disposed in the area and forms an open space between the sensing coil and the metal portion that varies based on movement of the sensing coil.

The metal portion may include at least one protrusion in an area facing the sensing coil.

The metal portion may include a pair of metal support portions disposed on both sides of the sensing coil, respectively, to support the bracket.

The device may further include an elastic part that is disposed to support the metal portion, and which may be compression-deformed by pressure received from the metal portion as the touch is applied.

In one general aspect an electronic device includes a housing, a metal portion disposed to be spaced apart from the housing, and any of the touch sensing modules or devices described herein disposed between the housing and the metal portion, where the sensing coil of the touch sensing module or devices may be disposed to be spaced apart from the metal portion, while facing the metal portion, and configured to approach the metal portion as a touch is applied to the housing.

In a general aspect, a device with touch sensing includes a metal portion disposed to be spaced apart from the housing, and a touch sensing module disposed between the housing and the metal portion and configured to sense a touch applied to the housing, where the touch sensing module includes a sensing coil disposed to be spaced apart from the metal portion, while facing the metal portion, and configured to approach the metal portion as the touch is applied to the housing.

The device may be a mobile electronic device.

The touch sensing module may further include a bracket disposed between the housing and the sensing coil to support the sensing coil, and the bracket may be configured to deform from a non-deformed state, due to no touching being applied to the housing, to a deformed state due to the touch applied to the housing.

The metal portion may include a pair of metal support portions each extending in a direction toward the housing to support the bracket, and the sensing coil may be disposed between the pair of metal support portions.

The touch sensing module may further include a pad disposed between the housing and the bracket, where the pad may have a capacitance that varies as the touch is applied.

The pad may form a first resonant circuit, and the sensing coil may form a second resonant circuit, where the first resonant circuit may be configured to generate a first resonance signal having a first resonant frequency that that changes dependent on the applied touch, and where the second resonant circuit may be configured to generate a second resonance signal having a second resonant frequency that changes dependent on the applied touch.

The device may further include a detection circuit electrically connected to the first resonant circuit and the second resonant circuit, where the detection circuit may generate a contact touch input signal based on an amount of change in resonant frequency of the first resonance signal, and may generate a force touch input signal based on an amount of change in resonant frequency of the second resonance signal.

The metal portion may include at least one protrusion in an area facing the sensing coil.

The device may further include an elastic part that is disposed to support the metal portion, and which may be compression-deformed by pressure received from the metal portion as the touch is applied.

The sensing coil may have an inductance that varies based on a distance at which the sensing coil is variably spaced apart from the metal portion, and the touch sensing module may detect a strength of pressure by the touch based on a change in resonant frequency due to the variance in the inductance of the sensing coil, and generate a force touch input signal matched with the detected strength of the pressure.

The device may include one or more additional touch sensing modules, where each of the one or more additional touch sensing modules may include a respective metal portion, which is below a respective sensing coil that faces the respective metal portion, with the respective sensing coil being below a respective bracket, which is below the housing, and where each respective bracket is separated from each other, and where each of the respective sensing coils may be configured to sense respective touches being applied to the housing based on respective inductance changes of the respective sensing coils due to respective changes in distance between each of the respective sensing coils and the respective metal portions.

The housing may include a plurality of touch switch portions corresponding to the touch sensing module and the one or more additional touch sensing modules, respectively, where the device may detect a touch portion of the housing to which the touch is applied, among the plurality of touch switch portions, based on a change in resonant frequency of a resonant circuit due to a change in capacitance of the resonant circuit, and generate a contact touch input signal that matches the detected touch switch portion with a generated contact touch signal corresponding to the applied touch, and where the resonant circuit may include the capacitance and the sensing coil.

In one general aspect, a device with touch sensing includes a housing, where a portion of the housing is configured to be a touch button or switch portion, a deformable bracket below the housing. a sensing coil below the deformable bracket, an air gap below the sensing coil, and a metal portion disposed below the air gap, where the sensing coil faces the metal portion through the air gap, where a touch to the portion of the housing may force the sensing coil, due to deformation of the deformable bracket, to move into the air gap toward the metal portion, and where changes in inductance of the sensing coil due to the movement of the sensing coil may indicate a strength of a force of the touch to the portion of the housing.

The device may further include a capacitive pad below the housing, where the deformable bracket may be below the capacitive pad, and the touch to the portion of the housing may force the sensing coil, due to a deformation of the capacitive pad and the deformation of the deformable bracket, to move into the air gap toward the metal portion.

The sensing coil and the capacitive pad may be electrically connected as a resonant circuit, such that the strength of the force of the touch, through resulting changes to electrical characteristics of the resonant circuit, may indicate whether the detected touch of the portion is a true touch.

When the touch of the portion is detected due to capacitive changes of the capacitive pad, and the strength of the force of the touch meets a predetermined threshold, the touch may be determined to be the true touch, and when the touch of the portion is detected due to capacitive changes of the capacitive pad, and the strength of the force of the touch does not meet the predetermined threshold, the touch of the portion may be determined to not be the true touch and not an intended touch of a user.

Other features and aspects will be apparent from the following detailed description, the drawings, and the claims.

Figure 1:
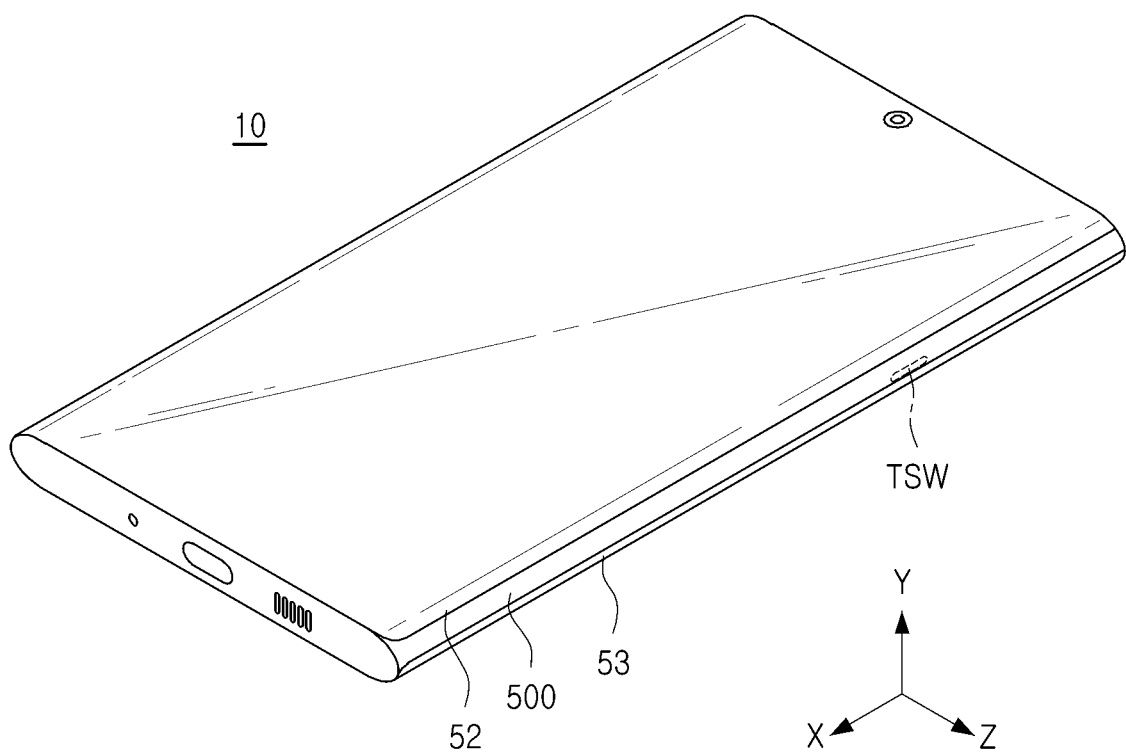
FIG. 1 is a perspective view illustrating an electronic device, according to one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof. In addition, the use of the term "may" herein with respect to an example or embodiment (e.g., as to what an example or embodiment may include or implement) means that at least one example or embodiment exists where such a feature is included or implemented, while all examples are not limited thereto.

Herein, a touch or a touch application may include a contact touch, while a force touch accompanies a pressing force of sufficient strength (pressure). For example, a contact may be determined without consideration of the force or may be a contact that does not accompany a substantive or sufficient force. As another example, a touch input generating an input signal in an electronic device may include a contact touch input generating contact touch input signal in a capacitive sensing manner and a force touch input generating an input signal in an inductive sensing manner.

Here, the touch input may refer only to a 'normal' or true touch for which an input signal may be generated for enabling the electronic device to be operated for one or more specific functions of the electronic device, and thus, may include excluding a touch that may be applied in error, e.g., when not a user's intention, among touches applied to a touch switch portion.

In addition, in one or more examples, the contact touch input and the force touch input may be simultaneously sensed or sensed at the same time in the electronic device in response to a single touch operation applied by the user. That is, when the user generates external pressure on the touch switch portion of the electronic device by applying a touch, the contact touch and the force touch on the touch switch portion may be simultaneously achieved, for example.

Accordingly, in various examples, a touch sensing module may include a pad sensing a contact touch and a sensing coil sensing a force touch together. In this case, the touch sensing module may perform hybrid sensing by which both capacitive sensing and inductive sensing may be achieved.

FIG. 1 is a perspective view illustrating an electronic device, according to one or more embodiments.

Referring to FIG. 1, the electronic device 10 may include a housing 500, a front display glass 52, a rear cover 53, and a touch switch portion TSW, for example. The electronic device may be considered a device with touch sensing.

The housing 500 may correspond to a body covering at least a partial area of the electronic device 10, and at the same time, may be integrally formed with a support structure forming a central skeleton of the electronic device 10. Here, the housing 500 may be formed of a conductive or non-conductive material in various example configurations of the electronic device 10.

The front display glass 52 may be disposed on one side of the housing 500, and the rear cover 53 may be disposed on the other side of the housing 500. That is, the electronic device 10 may include a side surface having a two-layer or three-layer structure, e.g., of the front display glass 52, the housing 500, and the rear cover 53.

As a non-limiting example, the touch switch portion(s) TSW may be formed on the side surface of the electronic device 10 and may be used to operate functions of the electronic device 10 similar to the use of mechanical buttons in previous electronic device approaches. For example, the touch switch portion TSW may correspond to a portion of the side surface through which a touch input is transferred, that is, a contact surface to which pressure may be applied by a user's hand or finger, for example. In addition, as demonstrated in FIG. 1, the touch switch portion TSW may correspond to one or more partial areas of the housing 500.

The electronic device 10 may be a portable device such as a smartphone or a wearable device such as a smart watch, but is not limited thereto, and examples include various portable or wearable devices, as well as other devices with touch or force sensing.

For example, the electronic device 10 may be a smartphone, a personal digital assistant, a digital video camera, a digital still camera, a network system, a computer, a monitor, a tablet, a laptop, a netbook, a television, a video game machine, a smart watch, or an automotive component, noting again that examples are not limited thereto.

Figure 2A:
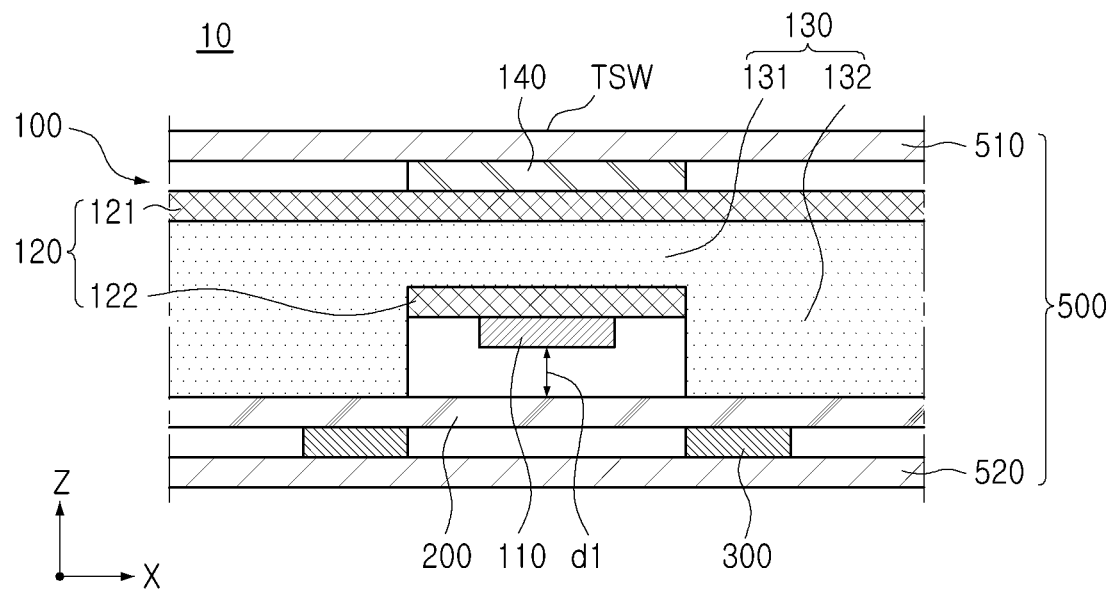
FIG. 2A and FIG. 2B are front views of an electronic device illustrating a change between before (FIG. 2A) and after (FIG. 2B) a touch is applied, according to one or more embodiments.
Figure 2B:
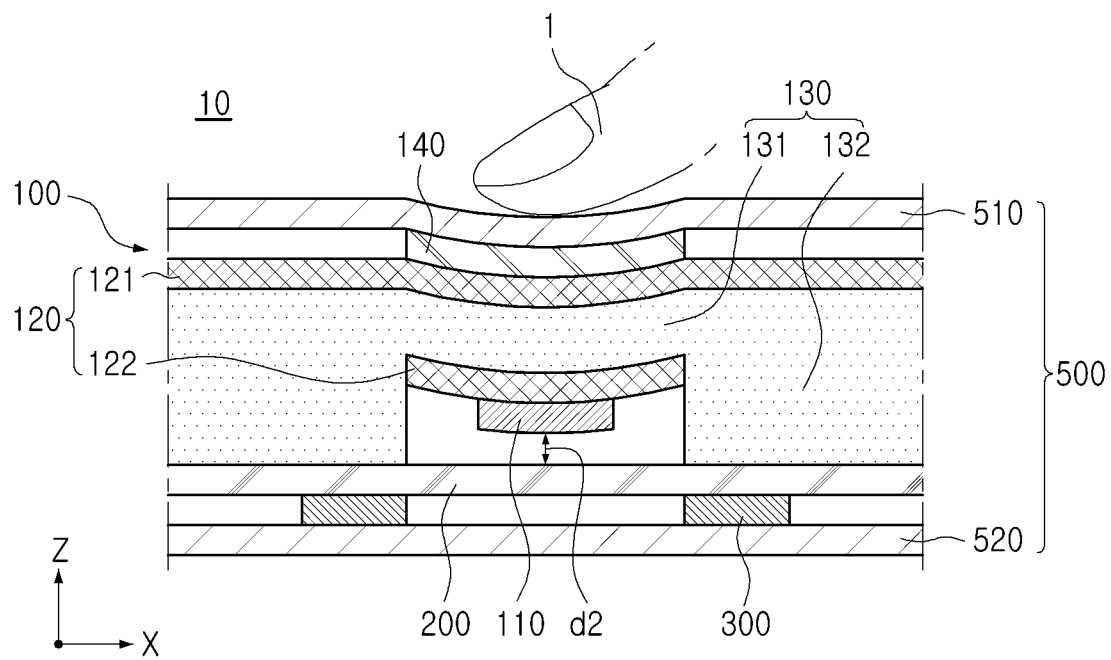

FIG. 2A and FIG. 2B are front views of an electronic device illustrating a change between before (FIG. 2A) and after (FIG. 2B) a touch is applied, according to one or more embodiments.

Figure 3:
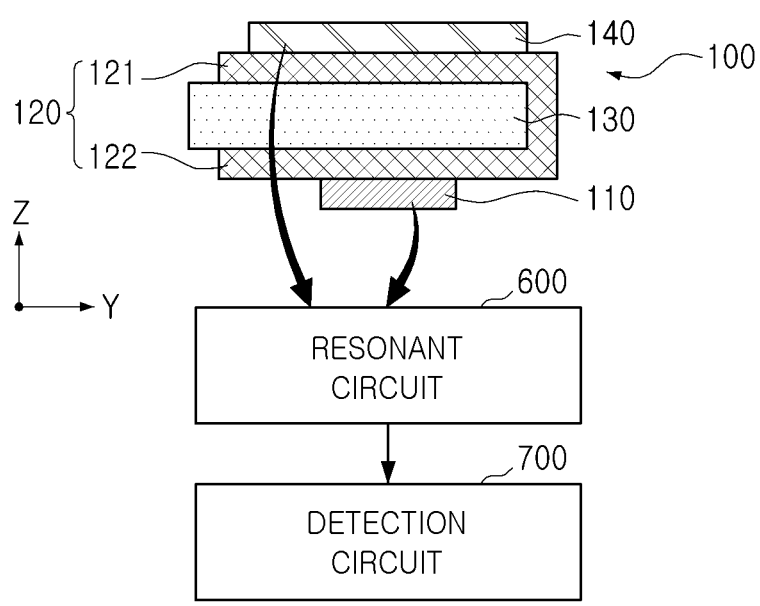
FIG. 3 is a front view of a touch sensing module illustrating an installation structure with a circuit-connected structure, according to one or more embodiments.

For example, FIG. 2A and FIG. 2B are front views of the electronic device in an X-Z direction schematically illustrating before (FIG. 2A) and after (FIG. 2B) illustrations demonstrating a touch being applied, and FIG. 3 is a front view of a touch sensing module in the X-Y direction illustrating a circuit-connected structure of the touch sensing modules. As an example, the touch sensing module of FIG. 3 may be the touch sensing module of FIG. 2A.

Referring to FIGS. 1 through 3, the electronic device 10 may include a touch sensing module 100 sensing a touch applied to the touch switch portion TSW of the housing 500. For example, the touch sensing module 100 may have a structure and form that may be easily installed inside the electronic device 10 in an insertion type. Touch sensing modules herein may be considered a device with touch sensing.

Meanwhile, although examples may be described with respect to one touch sensing module 100 arranged in the electronic device 10, examples include a plurality of the touch sensing modules 100 arranged in the electronic device 10. Thus, references herein to a touch sensing module 100 in the electronic device 10 also correspond examples with two or more of the touch sensing modules 100 being arranged in the electronic device.

Such plurality of touch sensing modules 100 may correspond to different touch switch portions TSW that perform separate button functions, respectively. In addition, any one or a plurality of touch sensing modules 100 may provide improved sensor sensitivity compared to previous approaches.

Referring to FIGS. 2A and 2B, the electronic device 10 according to one or more embodiments may include a housing 500, and the housing 500 may include an outer housing 510 and an inner housing 520, for example.

The outer housing 510 may correspond to an outwardly exposed portion of the electronic device 10, and include a touch switch portion TSW to which a user's touch may be applied. The inner housing 520 may correspond to a portion maintaining the skeleton inside the electronic device 10, and be spaced apart from the outer housing 510.

The electronic device 10 according to one or more embodiments may include a metal portion 200 disposed as being spaced apart from the housing 500.

More specifically, the metal portion 200 may be disposed between the outer housing 510 and the inner housing 520, and the touch sensing module 100 may be disposed between the outer housing 510 and the metal portion 200. The metal portion 200 may support the touch sensing module 100 that is disposed between the outer housing 510 and the metal portion 200.

The metal portion 200 may be disposed to 'naturally', e.g., without applied force, be spaced apart from a sensing coil 110 by a predetermined distance. When a touch is applied and accordingly the distance between the sensing coil 110 and the metal portion 200 decreases, the increasing closeness between the metal portion 200 and the sensing coil 110 may induce a change in inductance of the sensing coil 110.

Referring to FIGS. 2A and 3, the touch sensing module 100 according to one or more embodiments may include a sensing coil 110, a substrate 120, a bracket 130, and a pad 140, for example.

The sensing coil 110 may naturally, without applied force to the touch sensing module 110, be spaced apart from the metal portion 200, while facing the metal portion 200. However, as a touch is applied, the sensing coil 110 may approach the metal portion 200. At this time, as the touch is applied, the inductance of the sensing coil 110 may vary while the sensing coil 110 moves in the touch application direction toward the metal portion 200. That is, the sensing coil 110 and the metal portion 200 may cooperatively perform 'inductive sensing' in the electronic device 10 to sense a force touch input.

The sensing coil 110 may correspond to a wound-type coil, and examples exist with various shapes, and thus the shape of the wound-type coil is not limited to any particular form. For example, the sensing coil 110 may be formed in various shapes such as a square, a circle, or a track shape. In addition, the sensing coil 110 may have a structure resulting from a forming of a wiring pattern on a printed circuit board (PCB) or a flexible printed circuit board (FPCB) or by providing a chip inductor, for example. Thus, the illustrated sensing coil 110 is also representative of such PCB, FPCB, or other chip inductor form, as non-limiting examples.

As illustrated in FIGS. 2A and 2B, as the force touch is applied, the sensing coil 110 may move in a direction toward the metal portion 200, i.e., the distance between the sensing coil 110 and the metal portion 200 may decrease, for example, from distance d1 to a lesser distance d2.

At this time, a current may flow in the sensing coil 110, and a magnitude of an eddy current may change due to the change in the distance between the sensing coil 110 and the metal portion 200, which is a conductor, around the sensing coil 110. Then, due to the changed eddy current, the inductance of the sensing coil 110 may increase or decrease (L±ΔL). By sensing the change in inductance, the touch sensing module 100 may perform inductive sensing to determine whether or not a touch input is applied.

The substrate 120 may have respective spaces for disposing the sensing coil 110 and the pad 140, and may be supported by the bracket 130. In this case, independent substrates 120 for mounting the sensing coil 110 and the pad thereon, respectively, may be used, or a single substrate 120 for mounting the sensing coil 110 and the pad thereon together may be used.

The substrate 120 may correspond to an FPCB, but is not limited thereto. That is, various examples exist where the substrate 120 is a substrate of any of various types alternatively to the FPCB, e.g., as long as the structure of the substrate 120 includes at least one metal layer and at least one wiring layer that are alternately stacked, as an example.

For example, the substrate 120 may include a first substrate 121 and a second substrate 122 disposed on or above one side and on or below the other side of the bracket 130, respectively. The pad 140 may be disposed on the first substrate 121, and the sensing coil 110 may be disposed on the second substrate 122. In this case, respective portions of the sensing coil 110 and the pad 140 may be disposed to overlap, e.g., in the illustrated Z direction, each other at least partially.

In other words, the first substrate 121 may be disposed between the pad 140 and the bracket 130, and the second substrate 122 may be disposed between the sensing coil 110 and the bracket 130. In addition, the pad 140 may be disposed above one side of the bracket 130, and the sensing coil 110 may be disposed below the other side of the bracket 130 while similarly overlapping the pad 140 at least partially.

In such an example, the first and second substrates 121 and 122 may be connected to each other to form a single substrate 120, as illustrated in FIG. 3. That is, the substrate 120 may be formed as one body in its entirety, and a partial area of the substrate 120 may be bent such that the first and second substrates 121 and 122 are implemented on opposite sides of the bracket 130, respectively. Accordingly, the sensing coil 110 and the pad 140 may be mounted on the same one surface of the substrate 120.

Additionally, a winding axis of the sensing coil 110 and a central axis of a contact surface of the pad 140 may coincide with each other. Here, the touch switch portion TSW included in the outer housing 510 may be disposed such that the center thereof also coincides with the winding axis of the sensing coil 110.

In this case, through a single touch applied by the user to the touch switch portion TSW, a force touch may be applied to the sensing coil 110, and simultaneously, a contact touch may be applied to the pad 140. That is, since the centers of the touch switch portion TSW, the sensing coil 110, and the pad 140 may be aligned to coincide with each other, this may provide a more accurately performed hybrid sensing in one or more of the electronic devices herein, for example, noting that examples are not limited thereto.

The bracket 130 may be disposed between the outer housing 510 and the sensing coil 110 to support the sensing coil 110, and deformable as a touch is applied.

Referring to FIGS. 2A and 2B, as the touch is applied, the bracket 130 may be deformed to protrude in a direction toward the second substrate 122, that is, in a direction toward the sensing coil 110. At this time, the first and second substrates 121 and 122, which may be deformable, may also be deformed, together with the bracket 130, in the touch application direction. Also, at this time, the inductance of the sensing coil 110, disposed on the second substrate 122, may vary while the sensing coil 110 moves in the touch application direction, e.g., dependent on how much the bracket 130 and the substrate 120 are deformed. For example, the bracket 130 may be considered deformable from a non-deformed state or natural state due to no touching being applied proximate to the electronic device 10, e.g., due to no touching being applied to the outer housing 510 that is adjacent or proximate to the pad, to a deformed state to protrude or deform in a direction toward the sensing coil 110 as the touch is applied, resulting to the sensor coil 110 moving as discussed above.

The bracket 130 may include a pair of support portions 132, each extending from the first substrate 121 in the direction toward the metal portion 200 and in opposite lateral (X-directions) directions toward the second substrate 122, and the sensing coil 110 may be disposed between the pair of support portions 132. Also, the bracket 130 may further include a pressurization portion 131 disposed between the first and second substrates 121 and 122 and connecting the pair of support portions 132 to each other.

More specifically, the pressurization portion 131 may be disposed on the same vertical line as the sensing coil 110 and the pad 140 to receive pressure by the touch applied to the outer housing 510. Thus, when the pressurization portion 131 bends, the pressurization portion 131 may bend in the direction toward the metal portion 200 dependent on the strength of the received pressure.

The pair of support portions 132, each extending from the first substrate 121 in their respective directions toward the metal portion 200, may be disposed on both sides of the pressurization portion 131 to serve to support the first substrate 121 and the metal portion 200, so that the distances between the first substrate 121 and the metal portion 200 are maintained to be constant where the first substrate 121 and the metal portion 200 are separated by each of the pair of support portions 132.

As a further example, a thickness of each of the support portions 132 in an extending direction toward the metal portion 200, that is, a thickness of the support portion 132 in a vertical direction in FIG. 2A, may be greater than a sum of thicknesses of the pressurization portion 131, the second substrate 122, and the sensing coil 110 in the same direction toward the metal portion 200, again noting that there is a natural separation between the sensing coil 110 and the metal portion 200, e.g., the illustrated distance d1. Said another way, a predetermined distance exists between the sensing coil 110 and the metal portion 200.

As illustrated in FIGS. 2A and 2B, the bracket 130, including the pair of support portions 132 and the pressurization portion 131, may form a single open area as a whole.

With this form, the sensing coil 110 may be disposed to be surrounded by the pair of support portions 132 and the pressurization portion 131.

In other words, the bracket 130 and the metal portion 200 may be spaced apart from each other in an area to form an open space therebetween, and the sensing coil 110 may be disposed in the open space. For example, the sensing coil 110 may have been formed or may be disposed on one side of the pressurization portion 131 in the open space, so that sensing coil 110 is spaced apart from the metal portion 200. As a non-limiting example, the spacing between the sensing coil 110 and the metal portion 200 may also be referred to as an air gap.

The bracket 130 may be formed of a non-conductive material such as plastic or a conductive material such as metal. That is, the material of the bracket 130 is not limited to a particular material, as long as the material is capable of stably supporting the structure of the touch sensing module 100.

The pad 140 may be disposed between the outer housing 510 and the bracket 130, and have a capacitance that varies as a touch is applied to the housing 510.

Here, the pad 140 may correspond to a device performing capacitive sensing to sense a contact touch and may generate an input signal based on the sensed contact touch. Therefore, in varying example touch sensing modules in which the sensing coil 110 and the pad 140 are provided together, hybrid sensing can be performed, thereby simultaneously achieving inductive sensing and capacitive sensing. The pad 140 may also be understood to sense a proximate touch, as the housing 510 would separate the pad 140 from a bodily touch.

The pad 140 may be disposed to contact the outer housing 510 of the electronic device 10 to sense a change in capacitance as an external contact is applied to the touch switch portion TSW. In this case, the pad 140 and the sensing coil 110 may be disposed on the same vertical line, such that a force touch and a contact touch may be simultaneously sensed in response to a single touch operation.

Referring to FIG. 3, the sensing coil 110 and the pad 140 may also be electrically connected to each other to form a resonant circuit 600. In addition, the resonant circuit 600 including the sensing coil 110 and the pad 140 may be connected to the detection circuit 700.

The resonant circuit 600 may generate a resonance signal having a resonant frequency that varies as a touch is applied. The change in resonant frequency may be induced by a change in inductance occurring in the sensing coil 110, and the change in resonant frequency may also be induced by a change in capacitance occurring in the pad 140. Accordingly, the resonant circuit 600 may generate a resonance signal whose resonant frequency is changed when at least one of the inductance and the capacitance is changed.

The resonance signal generated by the resonant circuit 600 may be transmitted to the detection circuit 700. The detection circuit 700 may be electrically connected to the resonant circuit 600, and generate a touch input signal based on an amount of change in resonant frequency of the generated resonance signal.

Figure 4:
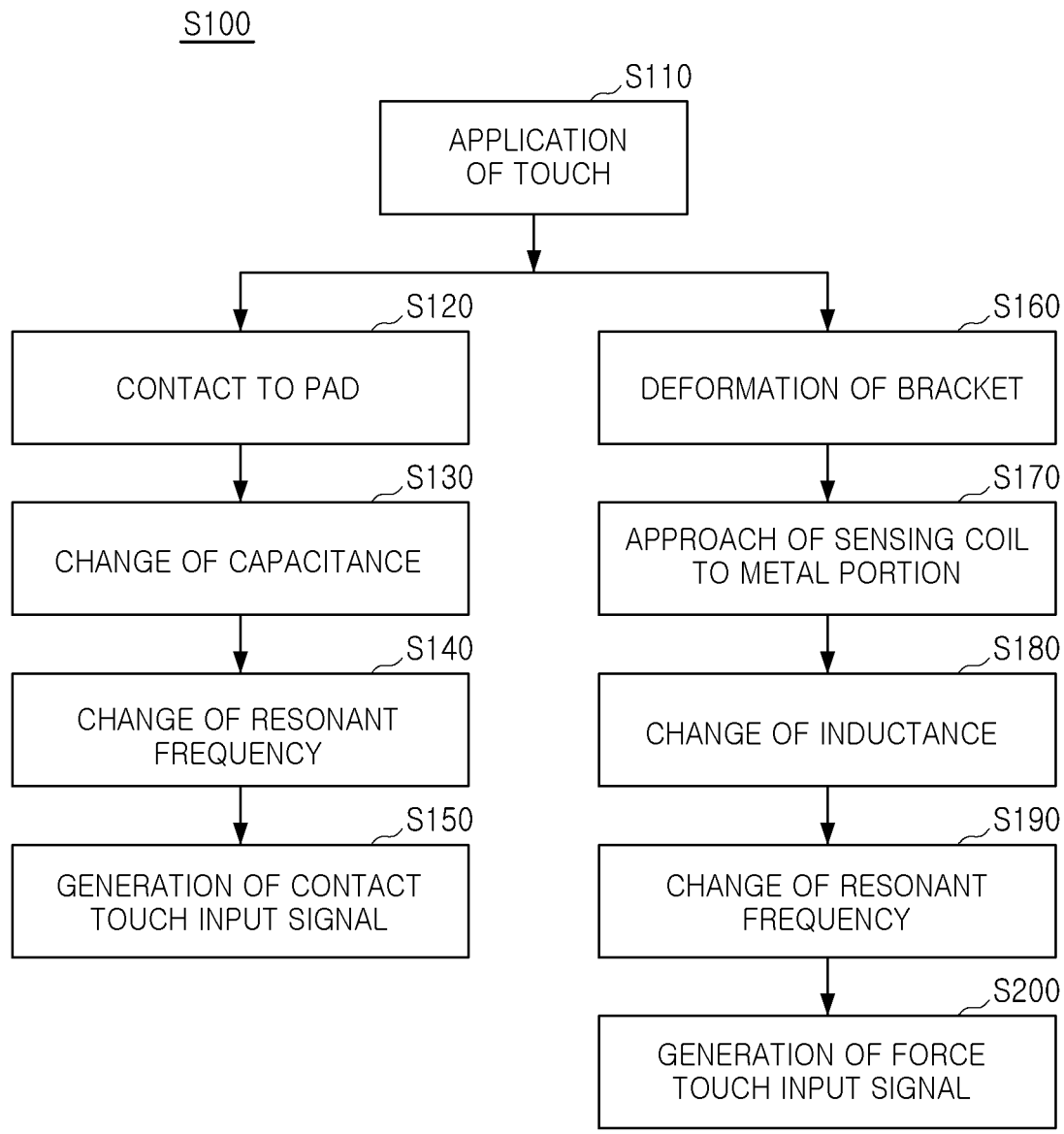
FIG. 4 is a schematic flowchart illustrating a method of sensing a contact touch and a force touch by a touch sensing module, according to one or more embodiments.

FIG. 4 is a schematic flowchart illustrating a method of sensing a contact touch and a force touch by the touch sensing module of FIG. 2A.

Hereinafter, an example series of steps S100 through which a contact touch input signal and a force touch input signal may be generated when a touch is applied to the touch switch portion TSW will be described with reference to FIGS. 3 and 4.

First, when the user applies a touch to the touch switch portion TSW (S110), a contact touch and a force touch of accompanying applied pressure are generated together.

The contact touch may be transferred to the pad 140 (S120), and cause a change in capacitance of the pad 140 as a result of the touch applied to the touch switch portion TSW by which a contact medium is changed (S130).

At this time, the change in capacitance occurring in the pad 140 may induce a change in resonant frequency of the resonance signal generated by the resonant circuit 600 (S140), and the detection circuit 700 may detect a location to which the touch is applied to the housing 500 based on the change in resonant frequency according to the change in capacitance of the pad 140. Then, the detection circuit 700 may generate a contact touch input signal including the detected location information (S150).

Here, the location to which the touch is applied may refer to, for example, a specific location to which the contact touch is applied by the user's hand on an area forming the contact surface of the pad 140. That is, the location to which the touch is applied may conceptually be for distinguishing whether the contact touch is applied to a center portion of the contact surface of the pad 140 or the contact touch is applied to a peripheral portion of the contact surface of the pad 140.

In this case, when the user's hand is in contact primarily or only with the peripheral portion on the contact surface of the pad 140 compared to the center portion of the contact surface of the pad 140, the detection circuit 700 may recognize the touch as a malfunction, as a false-positive, or as an inadvertent or unintended touch by the user. On the other hand, when the user's hand is in contact with an area including the center portion on the contact surface of the pad 140, the detection circuit 700 may recognize the touch as a normal or true touch that is intended by the user.

However, this is merely an example, as the detection circuit 700 may distinguishably recognize a touch in various ways in various examples with various locations to which the contact touch is applied by the user's hand on the area forming the contact surface of the pad 140.

As another example, the location to which the touch is applied may refer to what touch sensing module the contact touch is applied to among the plurality of touch sensing modules included in the electronic device 10. That is, when the plurality of touch sensing modules are closely co-located in the electronic device 10, one touch switch portion TSW and one pad 140 may be disposed in each of the touch sensing modules and the closeness of the respective pads 140 may result in multiple pads 140 having capacitance changes for one intended contact. In this case, the determining of the location to which the touch is applied may identify what touch switch portion the user's hand is in contact with among the plurality of touch switch portions.

For example, the detection circuit 700 may sense one pad whose capacitance has been changed among the plurality of pads to determine what touch switch portion the user's hand is in contact with. At this time, the detection circuit 700 may also sense a change in inductance of the touch sensing module corresponding to the determined touch switch portion to determine the strength of applied pressure by the touch, thereby performing hybrid sensing.

Meanwhile, the force touch occurring as the user applies the touch to the touch switch portion TSW (S110) may deform the bracket 130 (S160). For example, as illustrated in FIG. 2B, the bracket 130 may be deformed to be bent or deformed in the touch application direction. Then, the sensing coil 110 disposed on one surface of the bracket 130 may in response approach the metal portion 200 (S170).

As the sensing coil 110, in which a current flows, becomes closer to the metal portion 200, an eddy current may be generated in the sensing coil 110, thereby causing a change in inductance (S180). That is, the sensing coil 110 may have an inductance that varies dependent on reductions in the distance at which the sensing coil 110 is spaced apart from the metal portion 200.

The change in inductance of the sensing coil 110 may induce a change in resonant frequency of the resonance signal generated by the resonant circuit 600 (S190), and the detection circuit 700 may detect a strength of the pressure by the touch based on the change in resonant frequency according to the change in inductance of the sensing coil 110. Then, the detection circuit 700 may generate a force touch input signal matched with the detected strength of the pressure (S200).

Here, the detection circuit 700 may determine whether the strength of the pressure applied to the touch switch portion TSW exceeds a threshold or does not exceed the threshold, and detect that a true touch has occurred, or that a 'normal touch' is confirmed, e.g., only with pressures exceeding the threshold. When it is determined that the true touch input has occurred, the detection circuit 700 may generate a corresponding touch input signal.

More specifically, the threshold for determining the true touch, or a normal touch, among a plurality of candidate touches applied to the touch switch portion TSW may be set in the touch sensing module 100.

Thus, as discussed above, for example, when the user applies a touch with relatively strong pressure to the touch switch portion TSW, a relatively large amount of change in resonant frequency may occur, and this value may exceed the preset threshold. Then, the touch with the relatively strong pressure applied by the user may cause a force touch input signal. On the other hand, when the user applies a touch with relatively weak pressure to the touch switch portion TSW, the distance between the sensing coil 110 and the metal portion 200 spaced apart from each other may be slightly changed, as compared with the distance before the touch is applied. In this case, the amount of change in inductance measured in the sensing coil 110 and the amount of change in resonant frequency of the resonance signal generated accordingly may not be large enough to exceed the preset threshold. Thus, since the touch with the relatively weak pressure applied by the user is not enough to generate an input signal, the touch may be determined as a malfunction, false-positive, or unintended touch rather than the true or normal touch input.

However, since the above-described method is merely an example, as the detection circuit 700 may generate a touch input signal through a determination process in various examples with varying arrangements and connection relationships between the plurality of sensing coils 110 and pads 140 included in the electronic device 10.

Referring to FIGS. 2A and 2B, the electronic device 10 according to one or more examples may further include an elastic part 300.

The elastic part 300 may be disposed to support the metal portion 200, and compression-deformed by pressure received from the metal portion 200 as a touch is applied. When the elastic part 300 is compression-deformed, the entire structure of the touch module including the metal portion 200 and the touch sensing module 100 may lower toward the inner housing 520.

The elastic part 300 may serve to support the touch sensing module 100 to be stably seated inside the electronic device 10, and at the same time, partially cushion the pressure transferred into the electronic device 10 by the touch applied by the user.

FIGS. 5-10 schematically illustrate front views of an electronic device, according to one or more embodiments.

Figure 5:
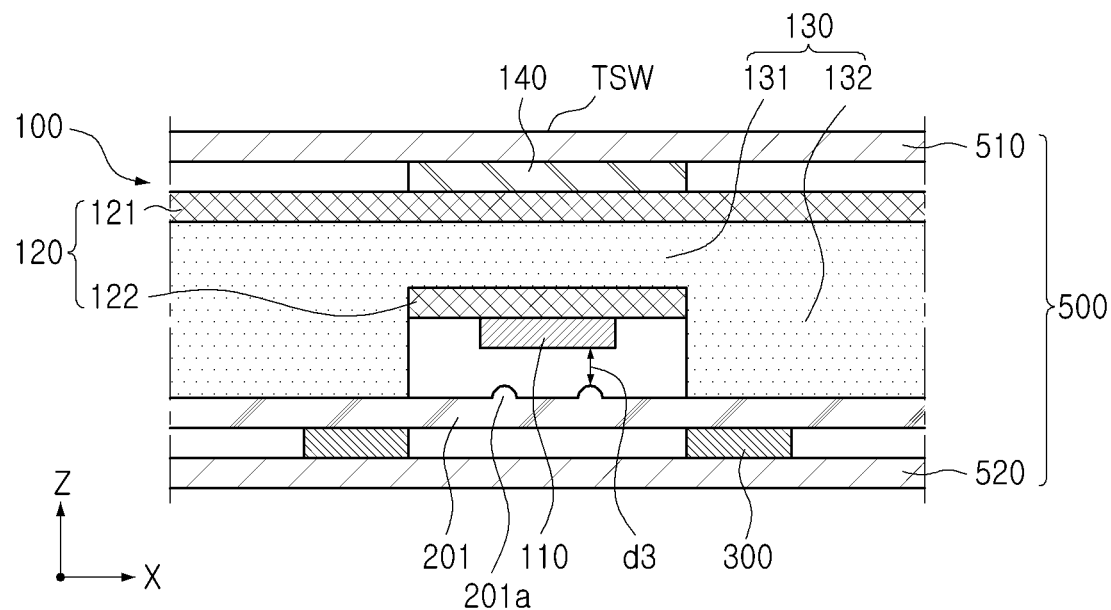
FIGS. 5-9 schematically illustrate front views of an electronic device, according to one or more embodiments.

For example, FIG. 5 illustrates the front view of an electronic device in an X-Z direction according to one or more embodiments. As a non-limiting example, the electronic device may be the electronic device 10 of FIG. 1.

Referring to FIG. 5, in an example the electronic device may include a housing 500 including an outer housing 510 and an inner housing 520, and a touch sensing module 100 sensing a touch applied to a touch switch portion TSW of the housing 500.

In addition, the electronic device may include a metal portion 201 disposed between the outer housing 510 and the inner housing 520. In this case, the touch sensing module 100 may be disposed between the outer housing 510 and the metal portion 201.

The metal portion 201 may support the touch sensing module 100 disposed between the outer housing 510 and the metal portion 201. The metal portion 201 may be spaced apart from a sensing coil 110 by a predetermined distance. When a touch is applied and accordingly the distance between the sensing coil 110 and the metal portion 201 decreases, the metal portion 201 may serve to induce a change in inductance of the sensing coil 110.

The metal portion 201 may include one or more protrusions 201a in an area facing the sensing coil 110. As illustrated in FIG. 5, a distance d3 between an uppermost end of the protrusion 201a and the sensing coil 110 spaced apart from each other may be smaller than that between an area of the metal portion 201 where the protrusion 201a is not formed and the sensing coil 110 spaced apart from each other. Accordingly, the metal portion 201 including the protrusion 201a may be easily utilized for the purpose of improving touch sensitivity in a structure in which the sensing coil 110 and the metal portion 201 are spaced apart from each other at a long distance.

The shape, height, number, and the like of the protrusion 201a included in the metal portion 201 are not limited, and may be set in various example manners according to internal structural characteristics of the electronic device.

The touch sensing module 100 included in the electronic device may be similar or the same to the touch sensing module 100 illustrated in FIGS. 2A through 3. That is, as a non-limiting example, the touch sensing module 100 may include a sensing coil 110, a substrate 120, a bracket 130, and a pad 140 of FIGS. 2A through 3, for example.

The sensing coil 110 may be spaced apart from the metal portion 201, while facing the metal portion 201. As a touch is applied, the sensing coil 110 may approach the metal portion 201, in particular, the protrusion 201a. At this time, as the touch is applied, the inductance of the sensing coil 110 may vary while the sensing coil 110 moves in a touch application direction.

The sensing coil 110 may correspond to a wound-type coil, and a shape thereof is not particularly limited. For example, the sensing coil 110 may be formed in various shapes such as a square, a circle, or a track shape. In addition, the sensing coil 110 may be implemented by forming a wiring pattern on a PCB or an FPCB or by providing a chip inductor, for example.

The substrate 120 may have spaces for disposing the sensing coil 110 and the pad 140, and be supported by the bracket 130.

The substrate 120 may correspond to an FPCB, but is not limited thereto. That is, in an example the substrate 120 may be used in any of various types in addition to the FPCB, e.g., as long as the structure of the substrate 120 has a structure in which at least one metal layer and at least one wiring layer are alternately stacked.

The substrate 120 may include a first substrate 121 and a second substrate 122 disposed on or above one side and on or below the other side of the bracket 130, respectively. The pad 140 may be disposed on the first substrate 121, and the sensing coil 110 may be disposed on the second substrate 122. In this case, the sensing coil 110 and the pad 140 may be disposed to overlap each other at least partially.

The first and second substrates 121 and 122 may be connected to each other to form a single substrate 120. That is, the substrate 120 may be partially bent or curved so that the first and second substrates 121 and 122 are connected to each other as one body. Accordingly, the sensing coil 110 and the pad 140 may be mounted on the same one surface of the substrate 120.

The bracket 130 may be disposed between the outer housing 510 and the sensing coil 110 to support the sensing coil 110, and deformed as a touch is applied.

As the touch is applied, the bracket 130 may be deformed to protrude in a direction toward the second substrate 122. At this time, the first and second substrates 121 and 122 may also be deformed, together with the bracket 130, to be bent in the touch application direction. Then, the sensing coil 110 disposed on the second substrate 122 may lower toward the metal portion(s) 201 by as much as the bracket 130 and the substrate 120 are deformed.

The bracket 130 may include a pair of support portions 132 each extending in a direction toward the sensing coil 110, and the sensing coil 110 may be disposed between the pair of support portions 132. Also, the bracket 130 may further include a pressurization portion 131 disposed between the first and second substrates 121 and 122 and connecting the pair of support portions 132 to each other.

The bracket 130 may be formed of a non-conductive material such as plastic or a conductive material such as metal. That is, the material of the bracket 130 is not limited to a particular material, as long as the material is capable of stably supporting the structure of the touch sensing module 100.

The pad 140 may be disposed between the outer housing 510 and the bracket 130, and have a capacitance varying as a touch is applied.

The pad 140 may be disposed to contact the outer housing 510 of the electronic device 11 to sense a change in capacitance as an external contact is applied to the touch switch portion TSW. In this case, the pad 140 and the sensing coil 110 may be disposed on the same vertical line, such that a force touch and a contact touch are simultaneously sensed in response to a single touch operation.

In addition, the electronic device may further include an elastic part 300.

The elastic part 300 may be disposed to support the metal portion 201, and compression-deformed by pressure received from the metal portion 201 as a touch is applied. When the elastic part 300 is compression-deformed, the entire structure of the touch module including the metal portion 201 and the touch sensing module 100 may lower toward the inner housing 520.

Figure 6:
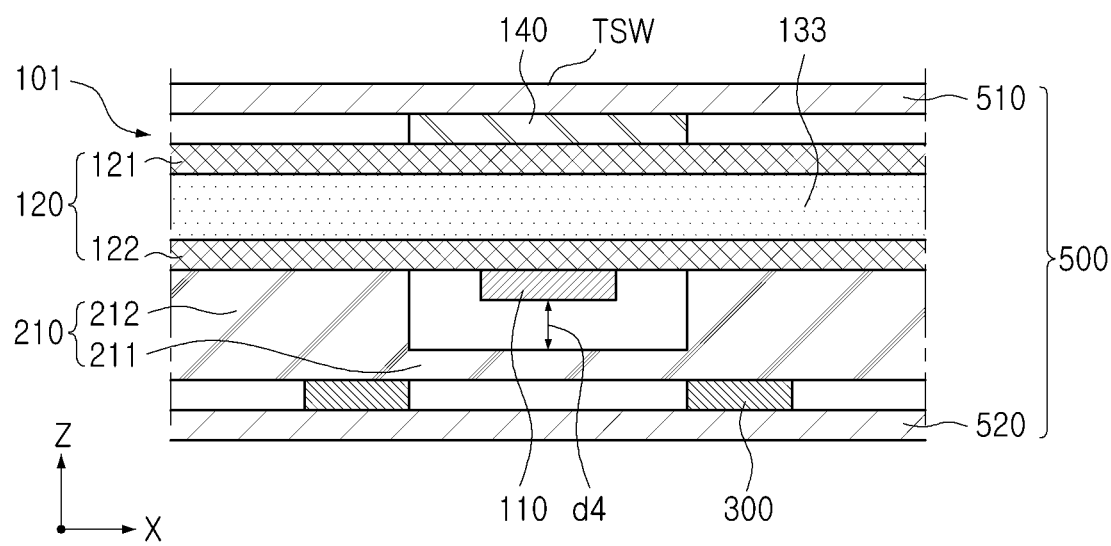

For example, FIG. 6 illustrates the front view of the electronic device in an X-Z direction according to one or more embodiments. As a non-limiting example, the electronic device may be the electronic device 10 of FIG. 1.

Referring to FIG. 6, the electronic device may include a housing 500 including an outer housing 510 and an inner housing 520, and a touch sensing module 101 sensing a touch applied to a touch switch portion TSW of the housing 500.

In addition, the electronic device may include a metal portion 210 disposed between the outer housing 510 and the inner housing 520. In this case, the touch sensing module 101 may be disposed between the outer housing 510 and the metal portion 210.

The metal portion 210 may support the touch sensing module 101 disposed between the outer housing 510 and the metal portion 201. The metal portion 210 may be spaced apart from a sensing coil 110 by a predetermined distance. When a touch is applied and accordingly the distance between the sensing coil 110 and the metal portion 210 decreases, the metal portion 210 may serve to induce a change in inductance of the sensing coil 110.

The metal portion 210 may include a pair of metal support portions 212 each extending in a direction toward the outer housing 510 to support a bracket 133 and a substrate 120. In this case, the sensing coil 110 may be disposed between the pair of metal support portions 212.

Also, the metal portion 210 may include a connection portion 211 disposed to be spaced apart from the sensing coil 110 and connecting the metal support portions 212 to each other. As a touch is applied, the sensing coil 110 may approach the connection portion 211.

As illustrated in FIG. 6, the metal portion 210 including the connection portion 211 and the metal support portions 212 as described above may be provided to surround the periphery of the sensing coil 110 while being spaced apart from the sensing coil 110.

In this case, as a touch is applied, the metal support portions 212 may receive pressure from the substrate 120 and the bracket 133 and transfer the received pressure to an elastic part 300 disposed under the metal portion 210. Accordingly, the elastic part 300 may be compression-deformed by the pressure.

The touch sensing module 101 included in the electronic device may include a sensing coil 110, a substrate 120, a bracket 130, and a pad 140.

The sensing coil 110 may be spaced apart from the connection portion 211 of the metal portion 210, while facing the connection portion 211 of the metal portion 210. As a touch is applied, the sensing coil 110 may approach the connection portion 211. At this time, as the touch is applied, the inductance of the sensing coil 110 may vary while the sensing coil 110 moves in a touch application direction.

Referring to FIG. 6, the sensing coil 110 and the metal portion 210 may be spaced apart from each other by a predetermined distance d4 before the touch is applied, and the predetermined distance therebetween may decrease as the touch is applied. In this case, the predetermined distance d4 may decrease as the sensing coil 110 moves.

The sensing coil 110 may correspond to a wound-type coil, and a shape thereof is not particularly limited. For example, the sensing coil 110 may be formed to have various shapes such as a square, a circle, or a track shape. In addition, the sensing coil 110 may be implemented by forming a wiring pattern on a PCB or an FPCB or by providing a chip inductor, for example.

The substrate 120 may have spaces for disposing the sensing coil 110 and the pad 140, and be supported by the bracket 133a.

The substrate 120 may correspond to an FPCB, but is not limited thereto. That is, for example, the substrate 120 may be used in any of various types in addition to the FPCB, e.g., as long as the structure of the substrate 120 has a structure in which at least one metal layer and at least one wiring layer are alternately stacked.

The substrate 120 may include a first substrate 121 and a second substrate 122 disposed on or above one side and on or below the other side of the bracket 133, respectively. The pad 140 may be disposed on the first substrate 121, and the sensing coil 110 may be disposed on the second substrate 122. In this case, the sensing coil 110 and the pad 140 may be disposed to overlap each other at least partially.

The first and second substrates 121 and 122 may be connected to each other to form a single substrate 120. That is, the substrate 120 may be bent or curved in a partial area so that the first and second substrates 121 and 122 are connected to each other as one body. Accordingly, the sensing coil 110 and the pad 140 may be mounted on the same one surface of the substrate 120.

The bracket 133 may be disposed between the outer housing 510 and the sensing coil 110 to support the sensing coil 110, and deformed as a touch is applied.

As the touch is applied, the bracket 133 may be deformed to be bent in a direction toward the second substrate 122. At this time, the first and second substrates 121 and 122 may also be deformed, together with the bracket 133, to be bent in the touch application direction. Then, the sensing coil 110 disposed on the second substrate 122 may lower toward the metal portion 210 as much as the bracket 133 and the substrate 120 are deformed.

The bracket 133 may have a flat shape. That is, since the metal support portions 212 of the metal portion 210 perform the supporting function, the bracket 133 may be formed to be flat without having to have a supporting structure. The first and second substrates 121 and 122 may be disposed n or above one side and on or below the other side of the bracket 133 having the flat shape, respectively.

The bracket 133 may be formed of a non-conductive material such as plastic or a conductive material such as metal. That is, the material of the bracket 133 is not limited to a particular material, as long as the material is capable of stably supporting the structure of the touch sensing module 101.

The pad 140 may be disposed between the outer housing 510 and the bracket 133, and have a capacitance varying as a touch is applied.

The pad 140 may be disposed to contact the outer housing 510 of the electronic device to sense a change in capacitance as an external contact is applied to the touch switch portion TSW. In this case, the pad 140 and the sensing coil 110 may be disposed on the same vertical line, such that a force touch and a contact touch are simultaneously sensed in response to a single touch operation.

In addition, the electronic device may further include an elastic part 300.

The elastic part 300 may be disposed to support the metal portion 210, and compression-deformed by pressure received from the metal portion 210 as a touch is applied. When the elastic part 300 is compression-deformed, the entire structure of the touch module including the metal portion 210 and the touch sensing module 101 may lower toward the inner housing 520.

Figure 7:
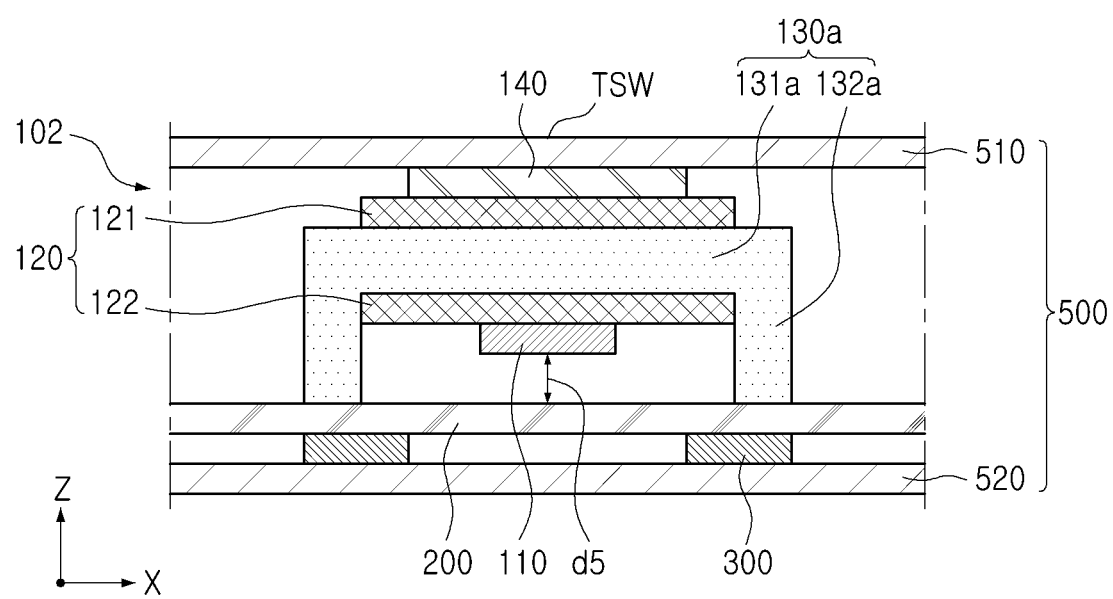

For example, FIG. 7 illustrates the front view of the electronic device in an X-Z direction according to one or more embodiments. As a non-limiting example, the electronic device may be the electronic device 10 of FIG. 1.

Referring to FIG. 7, the electronic device may include a housing 500 including an outer housing 510 and an inner housing 520, and a touch sensing module 102 sensing a touch applied to a touch switch portion TSW of the housing 500.

In addition, the electronic device may include a metal portion 200 disposed between the outer housing 510 and the inner housing 520. In this case, the touch sensing module 102 may be disposed between the outer housing 510 and the metal portion 200.

The metal portion 200 may support the touch sensing module 102 disposed between the outer housing 510 and the metal portion 200. The metal portion 200 may be spaced apart from a sensing coil 110 by a predetermined distance. When a touch is applied and accordingly a distance between the sensing coil 110 and the metal portion 200 decreases, the metal portion 200 may serve to induce a change in inductance of the sensing coil 110.

The touch sensing module 102 included in the electronic device may include a sensing coil 110, a substrate 120, a bracket 130a, and a pad 140, for example.

The sensing coil 110 may be spaced apart from the metal portion 200, while facing the metal portion 200. As a touch is applied, the sensing coil 110 may approach the metal portion 200. At this time, as the touch is applied, the inductance of the sensing coil 110 may vary while the sensing coil 110 moves in a touch application direction.

Referring to FIG. 7, the sensing coil 110 and the metal portion 200 may be spaced apart from each other by a predetermined distance d5 before the touch is applied, and the predetermined distance therebetween may decrease as the touch is applied. In this case, the predetermined distance d5 may decrease as the sensing coil 110 moves.

The sensing coil 110 may correspond to a wound-type coil, and a shape thereof is not particularly limited. For example, the sensing coil 110 may be formed in various shapes such as a square, a circle, or a track shape. In addition, the sensing coil 110 may be implemented by forming a wiring pattern on a PCB or an FPCB or by providing a chip inductor, for example.

The substrate 120 may have spaces for disposing the sensing coil 110 and the pad 140, and be supported by the bracket 130a.

The substrate 120 may correspond to an FPCB, but is not limited thereto. That is, for example, the substrate 120 may be used in any of various types in addition to the FPCB, e.g., as long as the structure of the substrate 120 has a structure in which at least one metal layer and at least one wiring layer are alternately stacked.

The substrate 120 may include a first substrate 121 and a second substrate 122 disposed on or above one side and on or below the other side of the bracket 130a, respectively. The pad 140 may be disposed on the first substrate 121, and the sensing coil 110 may be disposed on the second substrate 122. In this case, the sensing coil 110 and the pad 140 may be disposed to overlap each other at least partially.

The first and second substrates 121 and 122 may be connected to each other to form a single substrate 120. That is, the substrate 120 may be bent or curved in a partial area so that the first and second substrates 121 and 122 are connected to each other as one body. Accordingly, the sensing coil 110 and the pad 140 may be mounted on the same one surface of the substrate 120.

The bracket 130a may be disposed between the outer housing 510 and the sensing coil 110 to support the sensing coil 110, and deformed as a touch is applied.

As the touch is applied, the bracket 130a may be deformed to protrude in a direction toward the second substrate 122. At this time, the first and second substrates 121 and 122 may also be deformed, together with the bracket 130a, to be bent in the touch application direction. Then, the sensing coil 110 disposed on the second substrate 122 may lower toward the metal portion 200 as much as the bracket 130a and the substrate 120 are deformed.

The bracket 130a may include a pair of support portions 132a each extending in the direction toward the second substrate 122, and the sensing coil 110 may be disposed between the pair of support portions 132a. Also, the bracket 130a may further include a pressurization portion 131a disposed between the first and second substrates 121 and 122 and connecting the pair of support portions 132a to each other.

Here, the support portions 132a of the bracket 130a may have left and right widths limited to a predetermined length, as illustrated in FIG. 7. That is, since the left and right widths of the support portions 132a are limited, the bracket 130a may have a 'U' shape as a whole.

Accordingly, respective substrates 120 included in a plurality of touch sensing modules 102 may also be formed to be separate from each other, like the bracket 130a. Then, the touch sensing modules 102, each including the pad 140, the substrate 120, the bracket 130a, and the sensing coil 110, may be each individually mounted or detached into or from the electronic device.

In addition, the support portion 132a of the bracket 130a may be disposed between different sensing coils 110 to block signals therebetween, thereby reducing malfunctions caused due to interference and noise between the signals.

The bracket 130a may be formed of a non-conductive material such as plastic or a conductive material such as metal. That is, the material of the bracket 130a is not limited to a particular material, as long as the material is capable of stably supporting the structure of the touch sensing module 102.

The pad 140 may be disposed between the outer housing 510 and the bracket 130a, and have a capacitance varying as a touch is applied.

The pad 140 may be disposed to contact the outer housing 510 of the electronic device to sense a change in capacitance as an external contact is applied to the touch switch portion TSW. In this case, the pad 140 and the sensing coil 110 may be disposed on the same vertical line, such that a force touch and a contact touch are simultaneously sensed in response to a single touch operation.

In addition, the electronic device may further include an elastic part 300.

The elastic part 300 may be disposed to support the metal portion 200, and compression-deformed by pressure received from the metal portion 200 as a touch is applied. When the elastic part 300 is compression-deformed, the entire structure of the touch module including the metal portion 200 and the touch sensing module 102 may lower toward the inner housing 520.

Figure 8:
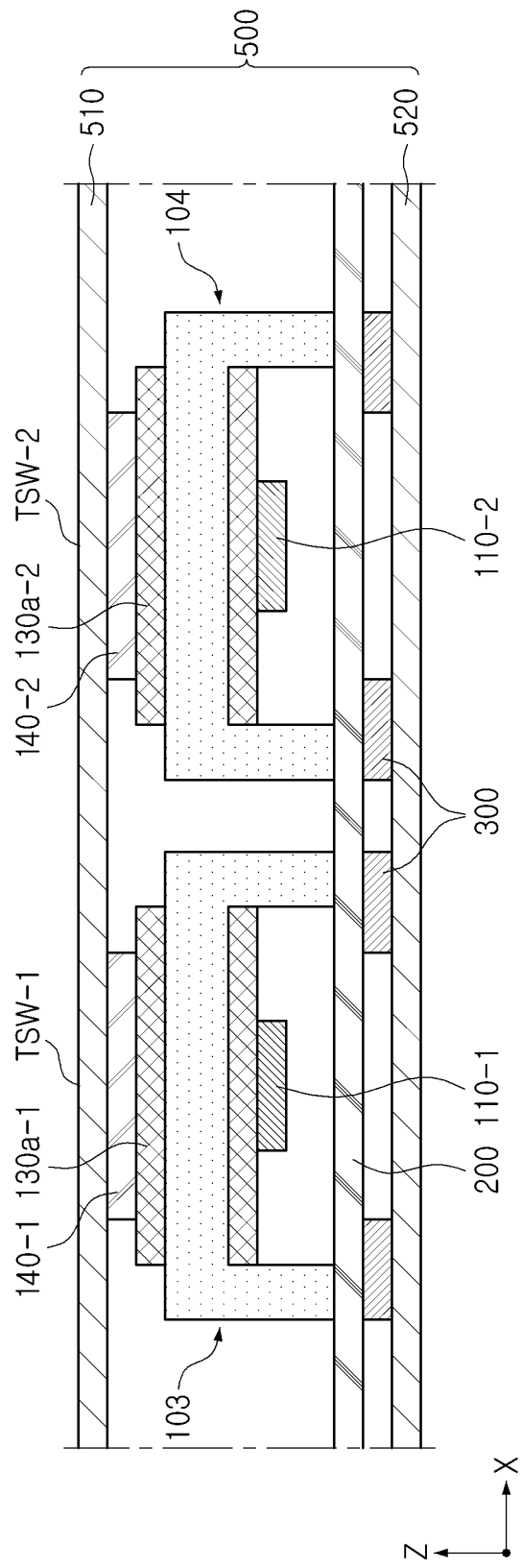

For example, FIG. 8 illustrates the front view of the electronic device in an X-Z direction according to one or more embodiments. As a non-limiting example, the electronic device may be the electronic device 10 of FIG. 1.

Referring to FIG. 8, the electronic device may include a plurality of touch sensing modules 103 and 104. While FIG. 8 illustrates two touch sensing modules, the electronic device may include one or three or more number of touch sensing modules in various examples.

As illustrated in FIG. 8, when the plurality of touch sensing modules 103 and 104 are arranged in the electronic device, the outer housing 510 may include a plurality of touch switch portions TSW-1 and TSW-2 corresponding to the respective touch sensing modules 103 and 104.

In addition, a plurality of sensing coils 110-1 and 110-2 and a plurality of pads 140-1 and 140-2 may be arranged in the electronic device. In this case, the plurality of sensing coils 110-1 and 110-2 may be disposed to be surrounded by a plurality of brackets 130a-1 and 130a-2 disposed separately from each other, respectively.

The plurality of pads 140-1 and 140-2 may be disposed to be matched with the respective sensing coils 110-1 and 110-2 one-to-one to overlap each other. That is, the plurality of pads 140-1 and 140-2 may correspond to the respective touch switch portions TSW-1 and TSW-2 and the respective sensing coils 110-1 and 110-2.

In this case, the electronic device may detect a touch switch portion to which a touch is applied between the plurality of touch switch portions TSW-1 and TSW-2, based on a change in resonant frequency according to a change in capacitance, and generate a contact touch input signal matched with the detected touch switch portion.

Here, each of the plurality of brackets 130a-1 and 130a-2 may have left and right widths limited to a predetermined length, as illustrated in FIG. 8. That is, since the left and right widths of each of the brackets 130a-1 and 130a-2 are limited equally, the brackets each having a 'U' shape as a whole may be arranged in a row.

In this case, the respective brackets 130a-1 and 130a-2 included in the plurality of touch sensing modules 103 and 104 may be formed separately from each other. That is, the brackets 130a-1 and 130a-2 may be formed to be separate from each other, while having the predetermined left and right widths, as illustrated in FIG. 8. Accordingly, the different brackets 130a-1 and 130a-2 may be separated from each other rather, rather than being connected to each other.

Between the respective sensing coils 110-1 and 110-2, which are disposed to be surrounded by the plurality of brackets 130a-1 and 130a-2, signals are blocked from each other, thereby reducing malfunctions caused due to signal interference and noise between the different touch sensors.

The electronic device may include a metal portion 200 supporting the plurality of touch sensing modules 103 and 104. While FIG. 8 illustrates a metal portion 200 formed in an integrate type as a whole supports the plurality of touch sensing modules 103 and 104, examples include a separate metal portion being provided for each of the touch sensing modules 103 and 104.

In addition, an elastic part 300, which is compression-deformed as a touch is applied, may be disposed between the metal portion 200 and the inner housing 520. While two elastic parts 300 are provided for each of the plurality of touch sensing modules 103 and 104, examples exist with a various number of elastic parts 300 that may be freely arranged between the metal portion 200 and the inner housing 520.

Figure 9:
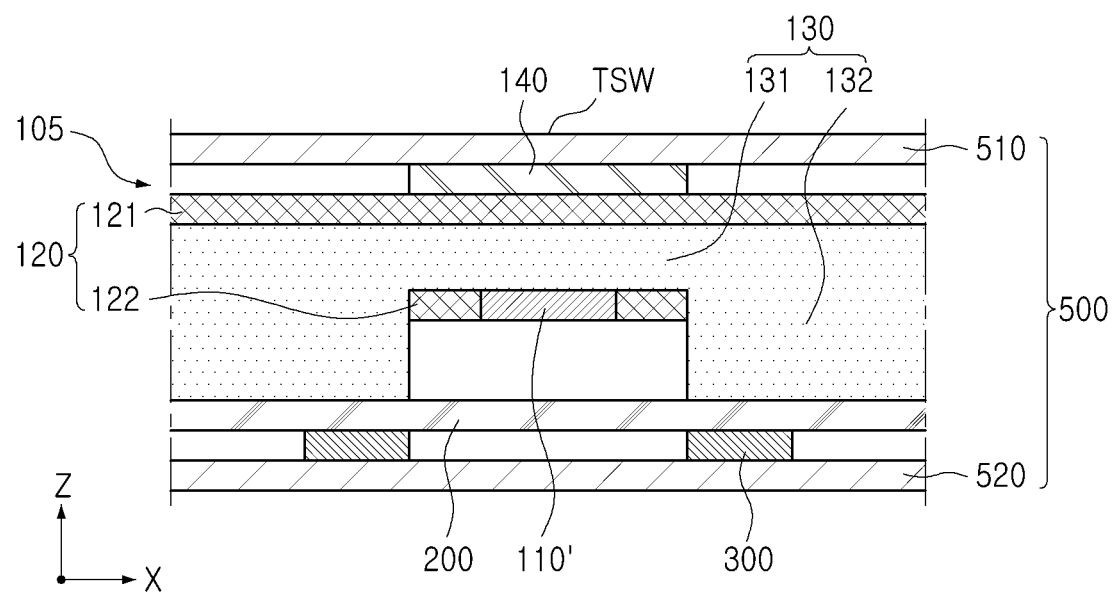

For example, FIG. 9 illustrates the front view of the electronic device in an X-Z direction according to one or more embodiments. As a non-limiting example, the electronic device may be the electronic device 10 of FIG. 1.

Referring to FIG. 9, the electronic device may include a housing 500 including an outer housing 510 and an inner housing 520, a metal portion 200, and an elastic part 300. In addition, a touch sensing module 105 included in the electronic device may include a sensing coil 110', a substrate 120, a bracket 130, and a pad 140.

Here, in various examples, the housing 500, the metal portion 200, the elastic part 300, the substrate 120, the bracket 130, and the pad 140 included in the electronic device may, respectively, be identical to those described above with reference to FIGS. 2A through 4. Thus, the overlapping description for the details thereof will be omitted.

The sensing coil 110' included in the touch sensing module 105 may be formed in a coil pattern inside the substrate 120. That is, as illustrated in FIG. 9, the sensing coil 110' may be formed inside the second substrate 122.

When the sensing coil 110' is formed in the coil pattern inside the second substrate 122 as described above, a long distance between the sensing coil 110' and the metal portion 200 spaced apart from each other can be secured, thereby further reducing a height of support portions 132 of the bracket 130.

In addition, the sensing coil 110' can be more stably disposed, as compared with the sensing coil mounted on the substrate. Accordingly, it is possible to reduce a risk that the sensing coil 110' may be damaged or separated from the second substrate 122, even though the bracket 130 and the second substrate 122 are deformed in shape by a touch applied to the touch switch portion TSW.

While the sensing coil 110' is illustrated as being disposed inside the second substrate 122, e.g., compared to the sensing coil 110 in the electronic device 10 illustrated in FIG. 2A, the application of the sensing coil 110' is not limited thereto. That is, examples also include the sensing coil 110' formed in the coil pattern inside the substrate 120 as illustrated in FIG. 9 also being alternatively applied to the above-described examples in FIGS. 5 through 8.

As set forth above and below, according to one or more embodiments, touch sensitivity to a force touch and a contact touch can be improved over previous approaches.

Further, since each sensor is separate from the other sensors, signals can be separated from each other, which may increase the potential that a malfunction due to signal interference and noise that occur between the different sensors may be prevented.

Further, the described hybrid sensing may be performed, thereby simultaneously sensing a force touch input and a contact touch input in response to a single touch operation.

In addition, even in examples where the housing of the electronic device is not formed of a metal material, the force sensing function can be performed by use of the metal portion provided in the touch module itself, inside the electronic device.

Figure 10:
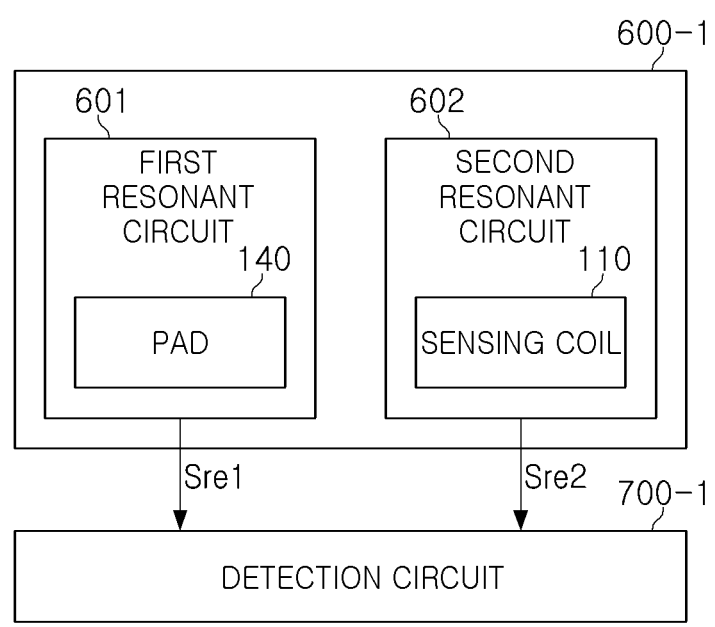
FIG. 10 is a perspective view illustrating an electronic device with a circuit-connected structure, according to one or more embodiments.

FIG. 10 is a perspective view illustrating an electronic device with a circuit-connected structure, according to one or more embodiments.

Referring to FIG. 10, a resonant circuit 600-1 may include a first resonant circuit 601 and a second resonant circuit 602. A pad 140 may form the first resonant circuit 601, and a sensing coil 110 may form the second resonant circuit 602. That is, the pad 140 and the sensing coil 110 included in one touch sensing module may respectively configure different resonant circuits, separate from each other. As a non-limiting example, the electronic device may be the electronic device 10 of FIG. 1, and the touch sensing coil 110 and pad 140 may correspond to any of the touch sensing coil 110 and pads 140 described above.

In addition, each of the first resonant circuit 601 and the second resonant circuit 602 may be connected to a detection circuit 700-1. While a structure in which the first resonant circuit 601 and the second resonant circuit 602 are connected to one detection circuit 700-1 is described, examples are not limited thereto, and examples include structures in which the first resonant circuit 601 is connected to one detection circuit 700-1 and the second resonant circuit 602 is connected to another, separate, detection circuit 700-1.

The first resonant circuit 601 may generate a first resonance signal Sre1 having a resonant frequency varying as a touch is applied. That is, as discussed above, when a change in capacitance occurs in the pad 140 as a touch is applied, a change in resonant frequency may be induced in the first resonant circuit 601. The first resonance signal Sre1 may be generated based on the changing resonant frequency in the first resonant circuit 601.

The second resonant circuit 602 may generate a second resonance signal Sre2 having a corresponding resonant frequency varying as the touch is applied. That is, when a change in inductance occurs in the sensing coil 110 as the touch is applied, a change in resonant frequency may be induced in the second resonant circuit 602. The second resonance signal Sre2 may be generated based on the changing resonant frequency in the second resonant circuit 602.

The first and second resonance signals Sre1 and Sre2, respectively generated by the first and second resonant circuits 601 and 602, may be provided to the detection circuit 700-1. For example, the detection circuit 700-1 is electrically connected to each of the first and second resonant circuits 601 and 602, and may generate a touch input signal based on the changes in the resonant frequencies of the generated first and second resonance signals Sre1 and Sre2.

In more detail, the detection circuit 700-1 may be electrically connected to the first resonant circuit 601. Further, the detection circuit 700-1 recognizes a contact touch applied to the pad 140 based on the amount of change in the resonant frequency of the first resonance signal Sre1 generated in the first resonant circuit 601, and may generate a contact touch input signal accordingly.

Also, the detection circuit 700-1 may be electrically connected to the second resonant circuit 602. Further, the detection circuit 700-1 recognizes a contact touch applied to the sensing coil 110 based on the amount of change in the resonant frequency of the second resonance signal Sre2 generated in the second resonant circuit 602, and may generate another contact touch input signal accordingly, e.g., a touch or force touch input signal.

In other words, when one touch is applied to the touch switch portion TSW (e.g., such as illustrated in any of FIGS. 1, 2A, 5-9) by a user, the touch may act as a contact touch on the pad 140, and may act as a force touch on the sensing coil 110. In addition, each of the contact touch and the force touch may generate separate touch input signals, that is, the contact touch input signal and the force touch input signal, respectively, by the detection circuit 700-1.

Here, a portion of the first resonant circuit 601 and a portion of the second resonant circuit 602, and the detection circuit 700-1 may be included in a sensor integrated circuit (IC) of the electronic device, such as the electronic device 10 of FIG. 1, as a non-limiting example. The electronic device of FIG. 10 is also representative of including a plurality of capacitors being provided in the sensor IC, where each may constitute a portion of a separate resonant circuit.

For example, the first resonant circuit 601 may include a pad 140, and is representative of further including a separate inductor and at least one capacitor included in the sensor IC. In this case, examples include various methods of implementing the separate inductor, and as an example, the separate inductor may be implemented as a chip inductor in the corresponding touch sensing module or otherwise in the electronic device.

The chip inductor, and the one capacitor included in the sensor IC may act as a resonator for generating a resonance signal, and may be connected to the pad 140, to generate a first resonance signal, based on the amount of change in the resonant frequency according to a capacitance change of the pad 140.

For example, the second resonant circuit 602 includes the sensing coil 110, and is representative of further including at least one capacitor in the sensor IC. The sensing coil 110 and the at least one capacitor included in the sensor IC may act as a resonator generating a resonance signal, and may generate a second resonance signal based on the amount of change in the resonant frequency according to an inductance change of the sensing coil 110.

While one example of the resonant circuit is described above, various examples include the resonant circuit configured in various ways and connected to the detection circuit 700-1. In addition, examples include various configuration of the sensor IC.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A device with touch sensing, the device comprising:
   a bracket;
   a pad disposed above one side of the bracket, the pad having a capacitance that varies as a touch is applied proximate to the device; and
   a sensing coil disposed on a lower side of the bracket that opposes the one side, with at least a portion of the sensing coil overlapping the pad.

2. The device of claim 1, wherein the sensing coil has an inductance that varies while the sensing coil moves in a touch application direction of the applied touch.

3. The device of claim 1, wherein the sensing coil and the pad are electrically connected to each other to form a resonant circuit, and
   the resonant circuit generates a resonance signal having a resonant frequency that varies as the touch is applied.

4. The device of claim 3, further comprising a detection circuit electrically connected to the resonant circuit, where the detection circuit is configured to generate a touch input signal based on an extent of change in resonant frequency of the generated resonance signal from the sensing coil moving in a touch application direction of the touch is applied.

5. The device of claim 4, wherein the detection circuit detects a location at which the touch is applied based on the change in the resonant frequency due to a change in capacitance of the pad, and generates a contact touch input signal including the detected location information.

6. The device of claim 4, wherein the detection circuit detects a strength of pressure by the applied touch based on the change in the resonant frequency due to a change in inductance of the sensing coil, and generates a force touch input signal matched with the detected strength of the pressure.

7. The device of claim 1, wherein the pad forms a first resonant circuit, and the sensing coil forms a second resonant circuit,
   wherein the first resonant circuit is configured to generate a first resonance signal having a first resonant frequency that that changes dependent on the applied touch, and
   wherein the second resonant circuit is configured to generate a second resonance signal having a second resonant frequency that changes dependent on the applied touch.

8. The touch sensing device of claim 7, further comprising a detection circuit electrically connected to the first resonant circuit and the second resonant circuit,
   wherein the detection circuit generates a contact touch input signal based on an amount of change in resonant frequency of the first resonance signal, and generates a force touch input signal based on an amount of change in resonant frequency of the second resonance signal.

9. The device of claim 1, wherein the bracket is deformable from a non-deformed state due to no touching being applied to the device, to a deformed state to protrude in a direction toward the sensing coil as the touch is applied.

10. The device of claim 1, further comprising:
    a first substrate disposed between the pad and the bracket; and
    a second substrate disposed between the sensing coil and the bracket.

11. The device of claim 10, wherein the first and second substrates are connected to each other to form a single substrate.

12. The device of claim 10, wherein the sensing coil is a coil pattern inside the second substrate.

13. The device of claim 1, wherein a winding axis of the sensing coil coincides with a central axis of a contact surface of the pad.

14. The device of claim 1, wherein the bracket includes a pair of support portions each extending in a lateral direction toward the sensing coil, and
    the sensing coil is disposed between the pair of support portions.

15. The device of claim 14, wherein the bracket further includes a pressurization portion adjacently between the pair of support portions, with the pressurization portion being disposed between the sensing coil and the bracket, and
    the sensing coil is disposed in an internal space surrounded by the pair of support portions and the pressurization portion.

16. The device of claim 1,
    wherein the device is a mobile electronic device that further comprises a housing, and
    wherein the touch that is applied proximate to the device is a touch applied to a portion of the housing that disposed adjacent to the pad, which is inside of the housing in the mobile electronic device.

17. The device of claim 1, wherein the device is a touch sensing module for use in touch detection based on a capacitance of the pad with respect to a human body portion that applies the touch, force detection with respect to the applied touch using the sensing coil.

18. A device with touch sensing, the device comprising:
a bracket configured to deform from a non-deformed state due to no touching being applied to the device, to a deformed state due to a touch applied proximate to the device; and
a sensing coil disposed below one side of the bracket and having an inductance that varies while the sensing coil moves in the deformed state in a touch application direction as the bracket is deformed.

19. The device of claim 18, further comprising a pad disposed above another side of the bracket that opposes the one side, wherein at least a portion of the pad overlaps the sensing coil, and wherein the pad has a capacitance that varies in response to the touch being applied proximate to the device.

20. The device of claim 18, further comprising a metal portion connected to the bracket and disposed to be spaced apart from the sensing coil,
wherein the inductance of the sensing coil varies as the sensing coil moves in the touch application direction toward the metal portion due to the applied touch.

21. The device of claim 20, wherein the bracket and the metal portion are spaced apart from each other to form an area therebetween, where the sensing coil is disposed in the area and forms an open space between the sensing coil and the metal portion that varies based on movement of the sensing coil.

22. The device of claim 20, wherein the metal portion includes at least one protrusion in an area facing the sensing coil.

23. The device of claim 20, wherein the metal portion includes a pair of metal support portions disposed on both sides of the sensing coil, respectively, to support the bracket.

24. The device of claim 20, further comprising an elastic part that is disposed to support the metal portion, and which is compression-deformed by pressure received from the metal portion as the touch is applied.

25. An electronic device comprising:
a housing;
a metal portion disposed to be spaced apart from the housing; and
the device with touch sensing of claim 1 disposed between the housing and the metal portion; and
wherein the sensing coil of the device with touch sensing is disposed to be spaced apart from the metal portion, while facing the metal portion, and configured to approach the metal portion as a touch is applied to the housing.

26. A device with touch sensing, the device comprising:
a housing;
a metal portion disposed to be spaced apart from the housing; and
a touch sensing module disposed between the housing and the metal portion and configured to sense a touch applied to the housing,
wherein the touch sensing module includes a sensing coil disposed to be spaced apart from the metal portion, while facing the metal portion, and configured to approach the metal portion as the touch is applied to the housing.

27. The device of claim 26, wherein the device is a mobile electronic device.

28. The device of claim 26, wherein the device further includes a bracket disposed between the housing and the sensing coil to support the sensing coil, and the bracket is configured to deform from a non-deformed state, due to no touching being applied to the housing, to a deformed state due to the touch applied to the housing.

29. The device of claim 28, wherein the metal portion includes a pair of metal support portions each extending in a direction toward the housing to support the bracket, and the sensing coil is disposed between the pair of metal support portions.

30. The device of claim 28, wherein the touch sensing module further includes a pad disposed between the housing and the bracket, where the pad has a capacitance that varies as the touch is applied.

31. The device of claim 30, wherein the pad forms a first resonant circuit, and the sensing coil forms a second resonant circuit,
wherein the first resonant circuit is configured to generate a first resonance signal having a first resonant frequency that that changes dependent on the applied touch, and
wherein the second resonant circuit is configured to generate a second resonance signal having a second resonant frequency that changes dependent on the applied touch.

32. The device of claim 31, further comprising a detection circuit electrically connected to the first resonant circuit and the second resonant circuit,
wherein the detection circuit generates a contact touch input signal based on an amount of change in resonant frequency of the first resonance signal, and generates a force touch input signal based on an amount of change in resonant frequency of the second resonance signal.

33. The device of claim 26, wherein the metal portion includes at least one protrusion in an area facing the sensing coil.

34. The device of claim 26, further comprising an elastic part that is disposed to support the metal portion, and which is compression-deformed by pressure received from the metal portion as the touch is applied.

35. The device of claim 26, wherein the sensing coil has an inductance that varies based on a distance at which the sensing coil is variably spaced apart from the metal portion, and
the touch sensing module detects a strength of pressure by the touch based on a change in resonant frequency due to the variance in the inductance of the sensing coil, and generates a force touch input signal matched with the detected strength of the pressure.

36. The device of claim 26, further comprising one or more additional touch sensing modules,
wherein each of the one or more additional touch sensing modules includes a respective metal portion, which is below a respective sensing coil that faces the respective metal portion, with the respective sensing coil being below a respective bracket, which is below the housing, and where each respective bracket is separated from each other,
each of the respective sensing coils is configured to sense respective touches being applied to the housing based on respective inductance changes of the respective sensing coils due to respective changes in distance between each of the respective sensing coils and the respective metal portions.

37. The device of claim 36, wherein the housing includes a plurality of touch switch portions corresponding to the touch sensing module and the one or more additional touch sensing modules, respectively,
the device detects a touch portion of the housing to which the touch is applied, among the plurality of touch switch portions, based on a change in resonant frequency of a resonant circuit due to a change in capacitance of the resonant circuit, and generates a contact touch input signal that matches the detected touch switch portion with a generated contact touch signal corresponding to the applied touch, and wherein the resonant circuit includes the capacitance and the sensing coil.

38. A device with touch sensing, the device comprising:

a housing, where a portion of the housing is configured to be a touch button or switch portion;

a deformable bracket below the housing;

a sensing coil below the deformable bracket;

an air gap below the sensing coil; and a metal portion disposed below the air gap, where the sensing coil faces the metal portion through the air gap, wherein a touch to the portion of the housing forces the sensing coil, due to deformation of the deformable bracket, to move into the air gap toward the metal portion, and wherein changes in inductance of the sensing coil due to the movement of the sensing coil indicates a strength of a force of the touch to the portion of the housing.

39. The device of claim 38, further comprising:

a capacitive pad below the housing, wherein the deformable bracket is below the capacitive pad, and the touch to the portion of the housing forces the sensing coil, due to a deformation of the capacitive pad and the deformation of the deformable bracket, to move into the air gap toward the metal portion.

40. The device of claim 39, wherein the sensing coil and the capacitive pad are electrically connected as a resonant circuit, such that the strength of the force of the touch, through resulting changes to electrical characteristics of the resonant circuit, indicates whether the detected touch of the portion is a true touch.

41. The device of claim 40, wherein, when the touch of the portion is detected due to capacitive changes of the capacitive pad, and the strength of the force of the touch meets a predetermined threshold, the touch is determined to be the true touch, wherein, when the touch of the portion is detected due to capacitive changes of the capacitive pad, and the strength of the force of the touch does not meet the predetermined threshold, the touch of the portion is determined to not be the true touch and not an intended touch of a user.

* * * * *